(12) United States Patent
Liang et al.

(10) Patent No.: US 9,783,881 B2
(45) Date of Patent: Oct. 10, 2017

(54) LINEAR EVAPORATION APPARATUS FOR IMPROVING UNIFORMITY OF THIN FILMS AND UTILIZATION OF EVAPORATION MATERIALS

(71) Applicant: NATIONAL CHUNG-SHAN INSTITUTE OF SCIENCE AND TECHNOLOGY, Taoyuan (TW)

(72) Inventors: Shih-Chang Liang, Taoyuan (TW); Wei-Chieh Huang, Taoyuan (TW); Chao-Nan Wei, Taoyuan (TW); Cuo-Yo Ni, Taoyuan (TW); Hui-Yun Bor, Taoyuan (TW)

(73) Assignee: NATIONAL CHUNG-SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 205 days.

(21) Appl. No.: 14/715,618

(22) Filed: May 19, 2015

(65) Prior Publication Data
US 2016/0047033 A1    Feb. 18, 2016

(30) Foreign Application Priority Data

Aug. 12, 2014 (TW) ............................. 103214289 U
Nov. 7, 2014 (TW) ............................. 103219719 U

(51) Int. Cl.
C23C 16/00 (2006.01)
C23C 14/24 (2006.01)
C23C 14/06 (2006.01)

(52) U.S. Cl.
CPC ........ C23C 14/243 (2013.01); C23C 14/0623 (2013.01)

(58) Field of Classification Search
CPC .................................................... C23C 14/243
USPC .................................................. 118/726, 727
See application file for complete search history.

(56) References Cited

U.S. PATENT DOCUMENTS

| 4,662,981 A | * | 5/1987 | Fujiyasu | ............... | C30B 23/066 |
| | | | | | 117/105 |
| 5,432,341 A | * | 7/1995 | Gspann | ................. | C23C 14/243 |
| | | | | | 250/251 |
| 6,110,531 A | * | 8/2000 | Paz de Araujo | ......... | B05D 1/00 |
| | | | | | 257/E21.009 |

(Continued)

FOREIGN PATENT DOCUMENTS

CN    203128644 U    8/2013

*Primary Examiner* — Keath Chen
(74) *Attorney, Agent, or Firm* — Leong C. Lei

(57) ABSTRACT

A linear evaporation apparatus includes a thermal insulation chamber, and crucibles, evaporation material heaters and a mixing chamber installed in the thermal insulation chamber. The mixing chamber includes a flow limiting and adjusting layer, a flow channel adjusting member, a mixed layer and a linear evaporation layer. The flow limiting and adjusting layer is a rectangular sheet with flow limit holes corresponsive to the crucibles respectively; the flow channel adjusting member is an interconnected structure having at least one flow inlet corresponsive to some of the flow limit holes and at least one flow outlet, and the mixed layer is a substantially I-shaped sheet structure, and the linear evaporation layer is a rectangular sheet having a linear source evaporation opening tapered from both ends to the middle, so as to improve the uniformity of the thin film and the utilization of the evaporation materials.

8 Claims, 9 Drawing Sheets

(56) References Cited

U.S. PATENT DOCUMENTS

| | | | |
|---|---|---|---|
| 6,202,591 B1 * | 3/2001 | Witzman | C23C 14/243 |
| | | | 118/723 VE |
| 6,837,939 B1 * | 1/2005 | Klug | C23C 14/12 |
| | | | 118/726 |
| 7,194,197 B1 | 3/2007 | Wendt et al. | |
| 8,202,368 B2 | 6/2012 | Britt et al. | |
| 2003/0222360 A1 * | 12/2003 | Randive | C23C 16/4481 |
| | | | 261/128 |
| 2004/0134430 A1 * | 7/2004 | Hass | C23C 14/22 |
| | | | 118/723 EB |
| 2005/0034672 A1 * | 2/2005 | Lee | C23C 14/243 |
| | | | 118/726 |
| 2006/0169211 A1 * | 8/2006 | Kim | C23C 14/24 |
| | | | 118/726 |
| 2008/0226270 A1 | 9/2008 | Wendt et al. | |
| 2008/0247737 A1 | 10/2008 | Wendt et al. | |
| 2008/0247738 A1 | 10/2008 | Wendt et al. | |
| 2009/0255467 A1 | 10/2009 | Britt et al. | |
| 2009/0255469 A1 | 10/2009 | Britt et al. | |
| 2009/0258444 A1 | 10/2009 | Britt et al. | |
| 2009/0258476 A1 | 10/2009 | Britt et al. | |
| 2010/0087016 A1 | 4/2010 | Britt et al. | |
| 2010/0159132 A1 | 6/2010 | Conroy et al. | |
| 2010/0173440 A1 | 7/2010 | Birkmire et al. | |
| 2010/0285218 A1 | 11/2010 | Conroy et al. | |

* cited by examiner

LINEAR EVAPORATION APPARATUS FOR IMPROVING UNIFORMITY OF THIN FILMS AND UTILIZATION OF EVAPORATION MATERIALS

CROSS-REFERENCE TO RELATED APPLICATIONS

This non-provisional application claims priority under 35 U.S.C. §119(a) on Patent Application No(s). 103214289 filed in Taiwan, R.O.C. on Aug. 12, 2014, and 103219719 filed in Taiwan, R.O.C. on Nov. 7, 2015 the entire contents of which are hereby incorporated by reference.

BACKGROUND OF THE INVENTION

1. Field of the Invention

The present invention relates to an evaporation apparatus, and more particularly to a linear evaporation apparatus capable of effectively enhancing the uniformity of an evaporated thin film and the utilization of an evaporation material.

2. Description of the Related Art

At present, different industries tend to use renewable energies to meet energy requirement, avoid energy shortage, and ensure the concept of business sustainability. For example, solar cell is one of the popular renewable energies. In addition to silicon-based solar cells and gallium arsenide (GaAs) solar cells, there is another type of potential solar cells such as copper-indium-gallium-selenium (CIGS) solar cells composed of Group I-III-VI2 elements having the features of high coefficient of optical absorption, excellent semiconductor property and flexible manufacture by substrates of different levels of hardness, so that the CIGS solar cell has become the type of solar cells with very high competitiveness in the solar cell industry.

The CIGS solar cell is produced by sequentially depositing a plurality of thin films with different functions on a substrate, and the substrate is generally made of a material containing sodium alkali glass (SLG), and composed of a Mo back contact, a CIGS absorber, a CdS buffer, an i-ZnO/AZO window and an Ni/Al front contact sequentially arranged from the top to the bottom of the substrate, wherein the Mo back contact and the i-ZnO/AZO window are formed by magnetron sputtering, and the CIGS absorber is formed by evaporation, and finally the Ni/Al front contact is deposited by electron beam evaporation, so as to complete the production of the CIGS solar cell.

In the evaporation CIGS absorber, evaporation materials are generally put into a plurality of containers, and a heater is provided for heating the containers, and—a CIGS thin film is formed on a substrate from the evaporation materials by a dot-pattern evaporation method. The dot-pattern evaporation method may be able to achieve the expected uniform evaporation effect in a small area, but the dot-pattern evaporation method is unable to form a CIGS thin film with uniform thickness for large continuous substrates. Since the evaporation point is generally situated at the center position of the substrate, the thickness of the CIGS thin film situated at the edge of the substrate is much smaller than the thickness at the center position of the substrate. In addition to the issue of the thickness uniformity of the CIGS thin film, the present evaporation equipments also has following drawbacks related to the control of the utilization of the evaporation materials, the durability of the evaporation source, and the stability and the evaporation speed of the evaporation process. 1. If an evaporation source device adopts an open design, the vapor distribution angle of the evaporation materials cannot be limited, so that an over-spilling condition may lower the utilization of the evaporation materials. Since the evaporation materials heated independently, molecules may collide and interfere with one another during the mixing and evaporation of the substrate, and the mixture of the evaporation materials may be non-uniform, and the cladding of CIGS thin films and the bonding of PN junctions.

2. As the quantity of evaporation materials gradually decreases with time during the manufacturing process, the liquid level of the evaporation materials drops to change the evaporation speed, so that the manufacturing process and composition cannot be controlled and quantified effectively. To manufacture large CIGS thin films and improve their uniformity, a linear evaporation method is generally adopted in the CIGS thin film manufacturing process, and the linear evaporation method is able to assure the uniformity of the large CIGS thin films by adjusting the area and shape of the evaporation port. As disclosed in P.R.C. Patent No. CN203128644 entitled "Linear evaporation source nozzle", the linear evaporation nozzle comprises an injection hood, an injection board installed on the injection hood, an injection port formed along the longitudinal direction of the injection board, and a shielding plate installed at the injection port for dividing the injection port into two sections. During use, the injection hood is placed on a linear evaporation source. As disclosed in the aforementioned linear evaporation source nozzle, the thin film formed by the linear evaporation source nozzle is more uniform than that produced by the dot-pattern evaporation method in a large-area evaporation process, and the thickness of the thin film is still non-uniform. When several evaporation materials are mixed and used in the evaporation process, the non-uniformity of the mixed materials is still not improved significantly.

In the manufacture of an absorber for copper-indium-gallium-selenium thin film solar cells as disclosed in U.S. Pat. No. 7,194,197B1, and U.S. Patent Application Nos. 2008/0247738A1, 2008/0247737A1, 2008/0226270A1, 2010/0173440A1, 2010/0087016A1, 2009/0258476A1, 2009/0258444A1, 2009/0255469A1, 2009/0255467A1, U.S. Pat. No. 8,202,368B2, 2010/0159132A1 and 2010/0285218A1, when such manufacturing method is applied to the manufacture of thin films, several sets of independent linear evaporation sources and reactive evaporation sources are separated to mix the vapors produced by the linear evaporation source of different evaporation materials effectively with one of the reactive vapors such as selenium vapor, sulfur vapor, or antimony vapor or their mixture to produce a large thin film. However, the utilization of the evaporation materials in the evaporation process often has the following problems. 1. The evaporation angle of the linear evaporation source changes with the evaporation distance from the center of the linear evaporation source, and the linear evaporation sources will interfere with one another during the mixing and evaporation processes due to the changing evaporation angle of the linear evaporation source and the temperature of the manufacturing process, so that the uniformity of the thin film will be reduced significantly. To improve the uniformity of the evaporation, it is necessary to cover the non-uniform positions produced from the evaporation in order to have a better uniformity in the evaporation area. However, such method will lower the effective utilization of the evaporation materials. 2. The temperature of a general linear evaporation source such as copper, indium or gallium exceeds 1000° C. in the manufacturing process. To avoid the reactive vapor from being affected by the thermal field generated by the linear evaporation source such as copper, indium or gallium with a high temperature, or the positions of the independent linear evaporation source and reactive evaporation source from being obstructed, the reactive vapor must be filled in the whole chamber before the mixed vapors of the linear evaporation sources such as copper, indium or gallium can be reacted with the reactive vapor. Although a large quantity of the reactive vapor is filled up in the chamber, the quantity of the reactive vapor being actually reacted in the evaporation area is very limited, because a vast majority of the reactive vapor is condensed at a cooler chamber wall or extracted by the vacuum pump, so that the utilization of the reactive evaporation materials is reduced significantly.

To overcome the aforementioned and other drawbacks, the present invention provides a linear evaporation apparatus to improve the thickness of the thin film and the uniformity of materials in the evaporation process. In view of the aforementioned drawback of the conventional film deposition, the inventor of the present invention provides a method for stably evaporating uniform thin films to produce the thin films with high stability, uniformity and production quality.

SUMMARY OF THE INVENTION

Therefore, it is a primary objective of the present invention to provide a linear evaporation apparatus for performing the mixing and evaporation processes, wherein the linear evaporation apparatus heats a plurality of different elements and mixes different materials according to a required proportion in a confined space of a mixing chamber, and carries out a film deposition of the mixture flowing out from a linear source evaporation opening. In the meantime, the linear source evaporation opening can prevent the thickness of the thin film from being affected by the viscosity of the evaporation materials in a long processing time to improve the composition and thickness uniformity of the thin film.

Another objective of the present invention is to provide a linear evaporation apparatus capable of improving the utilization of the evaporation materials and lowering the production cost effectively, wherein the linear evaporation apparatus carries out a procedure comprising the steps of heating up different elements, mixing the vapors of different evaporation materials in a mixing chamber, passing the mixed vapors into a high-temperature thermal insulation confined space, and carrying out a film deposition of the mixed vapors together with the vapor of a reactive evaporation material, wherein the high temperature cracks the vapor of the reactive evaporation material into smaller molecule groups, so as to improve the quality of the manufactured thin film.

To achieve the aforementioned objectives, the present invention provides a linear evaporation apparatus comprising a thermal insulation chamber, a plurality of crucibles, a plurality of evaporation material heaters, and a mixing chamber; the crucibles, the evaporation material heaters and the mixing chamber being disposed in the thermal insulation chamber, and the evaporation material heaters being sheathed on the crucibles respectively for heating the crucibles, and the mixing chamber being interconnected to an opening of each of the crucibles, characterized in that the mixing chamber from a near position to a far position of the crucibles sequentially comprises a flow limiting and adjusting layer, a flow channel adjusting member, a mixed layer and a linear evaporation layer, wherein the flow limiting and adjusting layer is a rectangular sheet having a plurality of flow limit holes corresponsive to the crucibles respectively, and the flow channel adjusting member is an interconnected structure having at least one flow inlet and at least one flow outlet, and the flow inlet is configured to be corresponsive to the position of some of the flow limit holes, and the mixed layer is a substantially I-shaped sheet structure, and the linear evaporation layer is a rectangular sheet having a linear source evaporation opening tapered from both ends to the middle of the linear evaporation layer.

Wherein, the crucible comes with a quantity of three, and both ends and the middle of the flow limiting and adjusting layer have two flow limit holes each, and the flow channel adjusting member is a substantially cross-shaped interconnected structure comprised of two horizontal members and a vertical member, and the two horizontal members are communicated with the vertical member and disposed on both sides of the vertical member respectively, each of the horizontal members on both sides of the vertical member has the flow inlet, and each side of the vertical member has the flow outlet, and the flow inlets of the horizontal members on both sides of the vertical member are disposed at positions corresponsive to the two flow limit holes at the middle of the flow limiting and adjusting layer, and the vertical member is disposed at a position other than those of the flow limit holes, and the flow limit holes on both sides of the vertical member are divided into two regional positions, and the two flow outlets are disposed between the two flow limit holes formed at both ends of the flow limiting and adjusting layer respectively. In addition, the linear source evaporation opening is tapered linearly or nonlinearly from both ends to the middle of the linear source evaporation opening to maintain the thickness uniformity of the thin film manufactured in the evaporation process.

In another preferred embodiment, the vapor of a reactive evaporation material is inputted into the thermal insulation chamber, reacted with a mixed and evaporated vapor dissipated from the mixing chamber, and sprayed out from the thermal insulation chamber. The present invention further comprises a reaction chamber, and the thermal insulation chamber is disposed in the reaction chamber to improve the utilization of different types of evaporation materials, and avoid an unnecessary waste or loss of materials caused by factors such as manufacturing conditions or temperature. The invention improves the quality of the thin film while lowering the manufacturing and material costs.

DETAILED DESCRIPTION OF THE PREFERRED EMBODIMENTS

Figure 1:
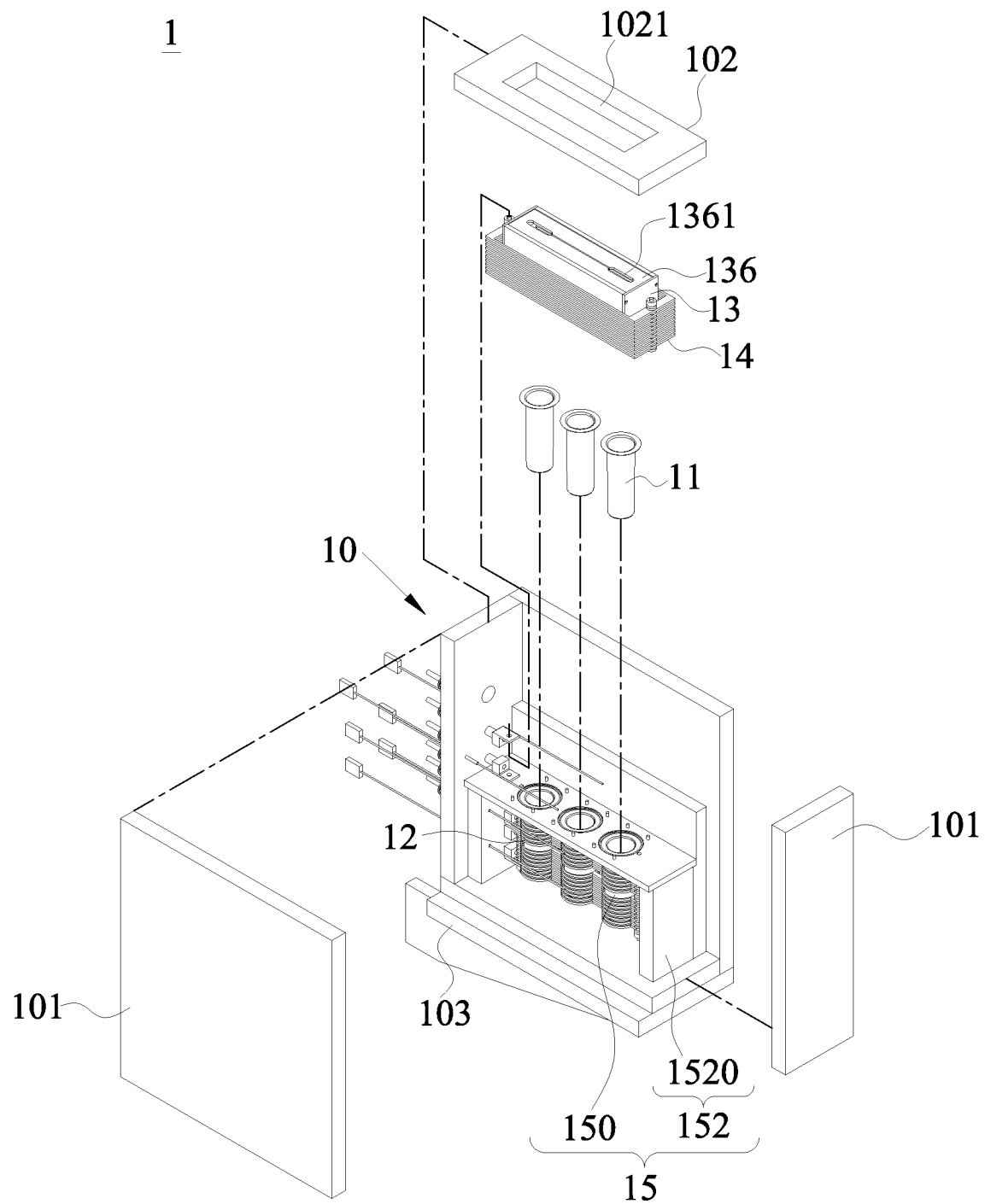
FIG. 1 is a partial exploded view of a first preferred embodiment of the present invention.
Figure 2:
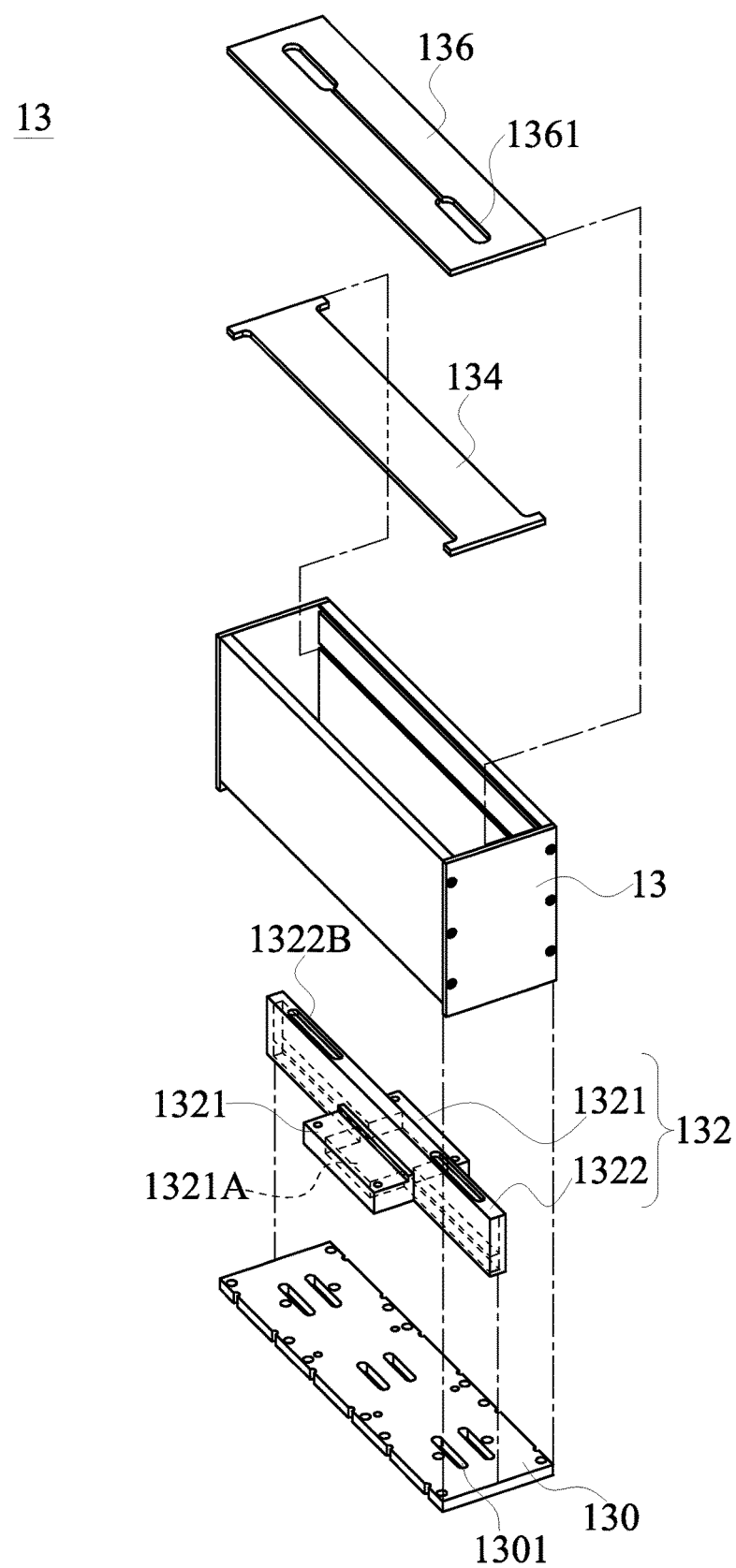
FIG. 2 is an exploded view of a mixing chamber of the first preferred embodiment of the present invention.
Figure 3:
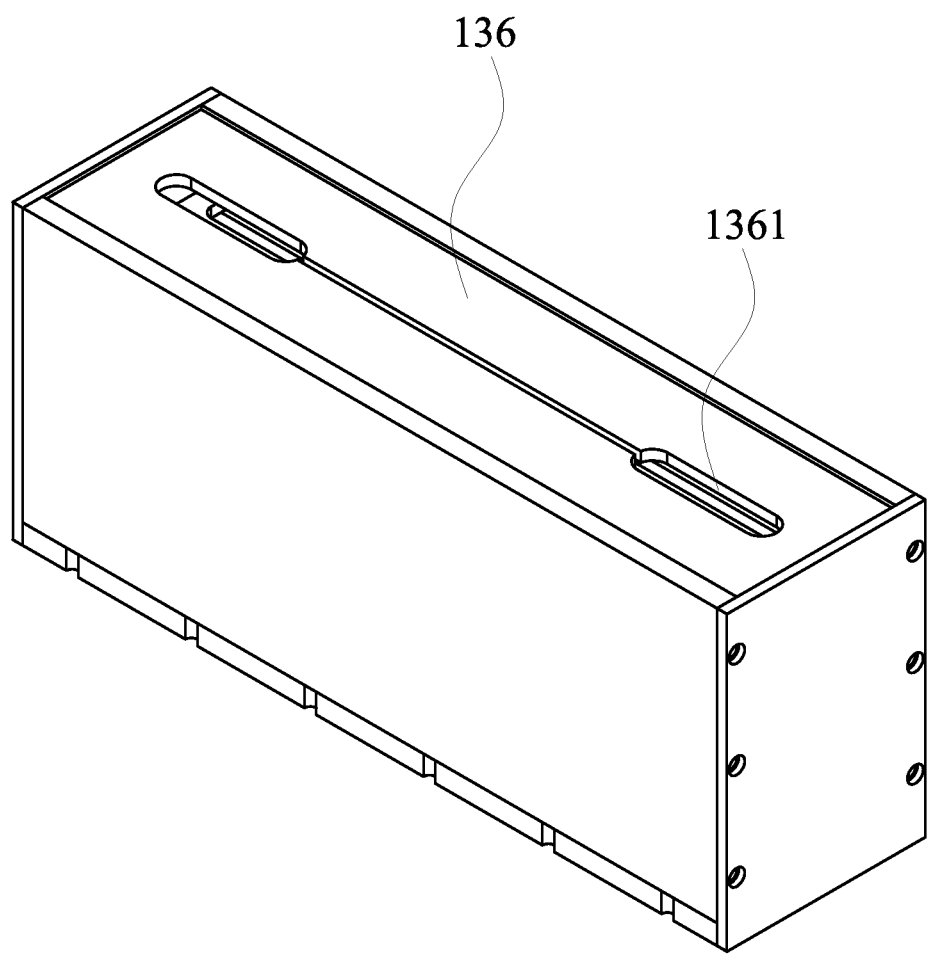
FIG. 3 is a schematic view of assembling a mixing chamber of the first preferred embodiment of the present invention.

The technical content of the present invention will become apparent with the detailed description of preferred embodiments and the illustration of related drawings as follows.

With reference to FIGS. 1 to 4 for a partial exploded view of a linear evaporation apparatus of a first preferred embodiment of the present invention, an exploded view of a mixing chamber, a schematic view of assembling the mixing chamber, and a schematic view showing the flowing direction of the gas of each evaporation material in a mixing chamber in accordance with the first preferred embodiment of the present invention respectively, the linear evaporation apparatus 1 comprises a thermal insulation chamber 10, a plurality of crucibles 11, a plurality of evaporation material heaters 12 and a mixing chamber 13. The crucibles 11, the evaporation material heaters 12 and the mixing chamber 13 are disposed in the thermal insulation chamber 10, and the evaporation material heaters 12 are installed at the crucibles 11 for heating the crucibles 11, and the mixing chamber 13 is communicated with openings of the crucibles 11.

The linear evaporation apparatus 1 is characterized in that the mixing chamber 13 comprises a flow limiting and adjusting layer 130, a flow channel adjusting member 132, a mixed layer 134 and a linear evaporation layer 136 sequentially arranged from a near position to a far position from the crucibles 11. Wherein, the flow limiting and adjusting layer 130 is a rectangular sheet and has a plurality of flow limit holes 1301 corresponsive to the crucibles 11 respectively for adjusting the quantity of vapor of an evaporation material (not shown in the figure) in each crucible 11 that enters into the mixing chamber 13. The flow channel adjusting member 132 is an interconnected structure having at least one flow inlet 1321A and at least one flow outlet 1322B, and the flow inlet 1321A is disposed at a position corresponsive to some of the flow limit holes 1301. The mixed layer 134 is substantially an I-shaped sheet structure. The linear evaporation layer 136 is a rectangular sheet having a linear source evaporation opening 1361 tapered from both ends to the middle position. With the flow limiting and adjusting layer 130, the flow channel adjusting member 132, the mixed layer 134 and the linear evaporation layer 136, the evaporation materials in the crucibles 11 are mixed with each other in the mixing chamber 13 according to the requirement. After the vapors of the evaporation materials are mixed in the mixing chamber, a mixed and evaporated vapor is formed.

In this preferred embodiment, there are three crucibles 11, but the present invention is not limited to such arrangement only. Where there are three crucibles 11, the flow limiting and adjusting layer 130 has the two flow limit holes 1301 formed at both ends and the middle of the flowing limiting and adjusting layer 130 each, so that the vapors of different evaporation materials in the crucibles 11 may flow into the mixing chamber 13 through the flow limit holes 1301.

Preferably, the flow channel adjusting member 132 is a cross-shaped interconnected structure comprised of two horizontal members 1321 and a vertical member 1322, and the two horizontal members 1321 are communicated with the vertical member 1322 and disposed on both sides of the vertical member 1322 respectively, and each of the horizontal members 1321 on both sides has the flow inlet 1321A, and the vertical member 1322 has the flow outlet 1322B formed separately at each of both ends of the vertical member. Wherein, the flow inlets 1321A of the horizontal members 1321 on both sides are arranged at positions corresponsive to the two flow limit holes 1301 formed at the middle of the flow limiting and adjusting layer 130 respectively, so that the horizontal members 1321 on both sides are covered onto the two flow limit holes 1301 respectively for guiding the vapors to flow into the mixing chamber 13 through the two flow limit holes 1301, and the vertical member 1322 is disposed at a position other than those of the flow limit holes 1301 and provided for dividing the flow limit holes 1301 formed on both sides of the vertical member 1322 into two regional positions respectively, and the two flow outlets 1322B are disposed between the two flow limit holes 1301 formed at both ends of the flow limiting and adjusting layer. Since the two horizontal members 1321 and the vertical member 1322 are interconnected structures, therefore the vapor of the evaporation material vapor entering from the two flow limit holes 1301 formed at the middle of the flow limiting and adjusting layer 130 into the mixing chamber 13 is guided by the two horizontal members 1321 to flow into the vertical member 1322 and then flow out from the two flow outlets 1322B.

The linear source evaporation opening 1361 is tapered linearly from both ends to the middle into a sandglass shape, or tapered nonlinearly into the shape of two opposite water drops or the shape of a dumbbell. In this preferred embodiment, the linear source evaporation opening 1361 is tapered nonlinearly into a dumbbell shape, so that the area of the opening at both ends of the linear source evaporation opening 1361 is greater than the area at the middle of the linear source evaporation opening 1361. When the evaporation materials flow out from the linear source evaporation opening 1361, the phenomenon of the evaporation materials being affected by the viscosity of the material can be reduced or eliminated, so as to maintain the thickness uniformity of the thin films formed in the evaporation process.

Wherein, the present invention further comprises a mixing chamber heater 14 and a crucible support 15, and the mixing chamber heater 14 is covered around the external periphery of the mixing chamber 13, so that when the vapors of the evaporation materials in the crucibles 11 are mixed, the required temperature is maintained to prevent affecting the mixing efficiency. The crucible support 15 includes a crucible containing member 150 and a fastener 152, and the crucible containing member 150 is provided for containing the crucibles 11, and the fastener 152 is comprised of a plurality of fixing plates 1520 and disposed around the external side of the crucible containing member 150, so that the crucibles 11 and the crucible containing member 150 can be fixed inside the thermal insulation chamber 10.

In addition, the thermal insulation chamber 10 comprises a plurality of side thermal insulation boards 101, a top thermal insulation board 102 and a bottom thermal insulation board 103, and the top thermal insulation board 102 includes at least one evaporation port 1021 configured to be corresponsive to the linear source evaporation opening 1361 of the linear evaporation layer 136 and provided for the mixed and evaporated vapors mixed in the mixing chamber 13 to perform an evaporation process and achieve the thermal insulation effect.

Figure 4:
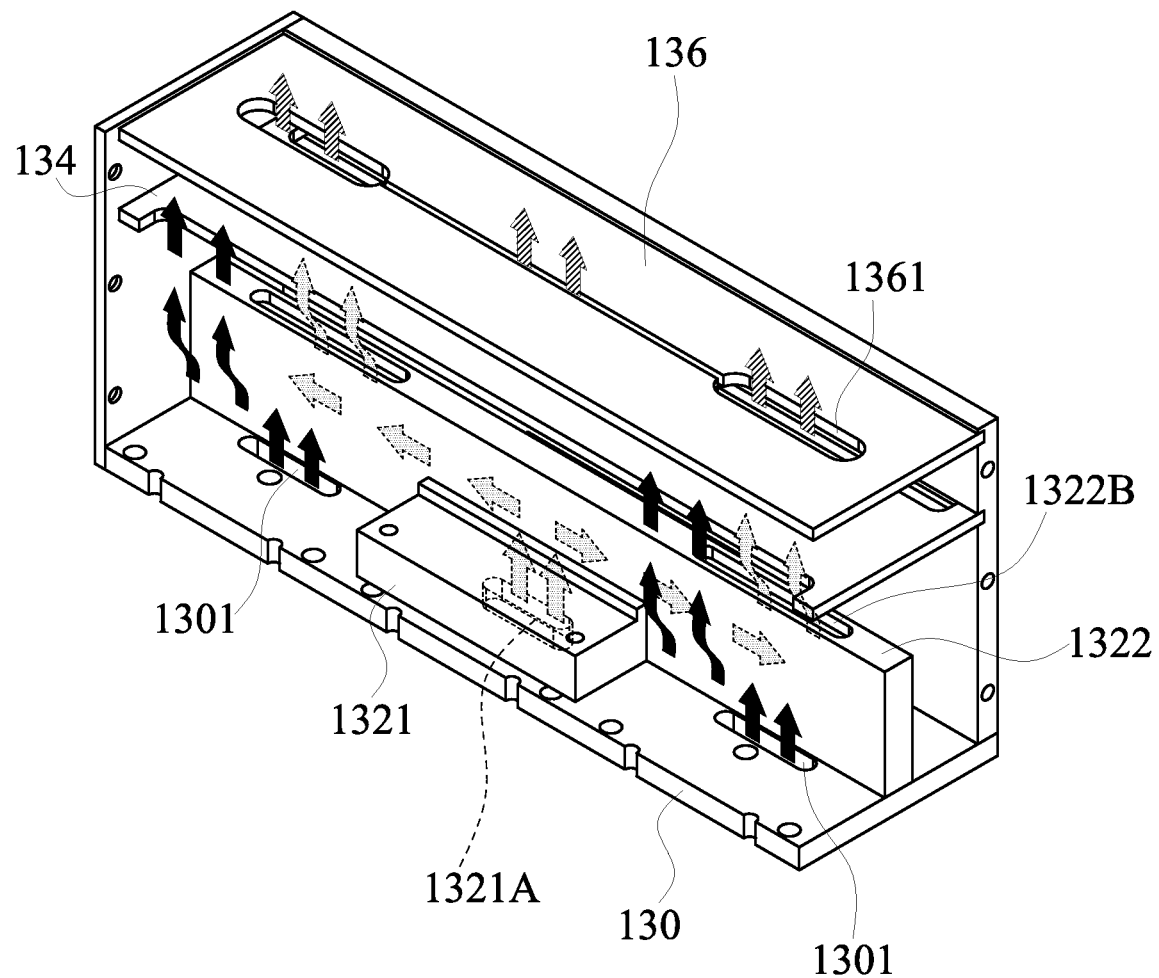
FIG. 4 is a schematic view showing the flowing direction of the gas of each evaporation material in a mixing chamber in accordance with the first preferred embodiment of the present invention.

During use, the vapors of the evaporation materials in the crucibles 11 flow upwardly from the openings of the crucibles 11 and pass through the flow limit holes 1301 into the mixing chamber 13. The vapor of the evaporation material flowing through the two flow limit holes 1301 at the middle of the flow limiting and adjusting layer 130 is guided to flow from the flow inlets 1321A of the two horizontal members 1321 into the flow channel adjusting member 132 and flow along the interconnected structure from the flow outlets 1322B of the vertical member 1322 towards the mixed layer 134. The vapor of the evaporation material passing through the flow limit holes 1301 at both ends of the flow limiting and adjusting layer 130 flows from the regional positions on both sides of the vertical member 1322 towards the mixed layer 134. Since the mixed layer 134 is substantially I-shaped, therefore the vapors of the evaporation materials flows from the opening of the mixed layer 134 towards the linear evaporation layer 136 and finally form the mixed and evaporated vapor which flows from the linear source evaporation opening 1361 to the outside for the evaporation process or other related manufacturing processes. In FIG. 4, the same evaporation material is put into the crucibles 11 both left and right sides, and another evaporation material is put into the crucible 11 at the middle.

In the following embodiment, the present invention is applied in the manufacturing process of copper-indium-gallium-selenium (CIGS) solar cells. The linear evaporation apparatus 1 is provided for manufacturing a CIGS thin film of a CIGS solar cell, wherein the crucibles 11 are provided for containing the evaporation materials including gallium (Ga), indium (In) and gallium (Ga) sequentially, so that gallium is put into the crucibles 11 on both left and right sides, and indium is put into the crucible 11 at the middle, the crucibles 11 are maintained at the temperature of 1040-1120° C. to control the evaporation speed of indium and gallium, and a ratio of the total area of the flow limit holes 1301 formed at both ends of the flow limiting and adjusting layer 130 to the total area of the flow limit holes 1301 at the middle position is defined, and such ratio and temperature may be adjusted to change the thickness and composition proportion of the CIGS thin film. During the CIGS thin film evaporation process, the elements including gallium and indium are mixed by the linear evaporation apparatus 1, the vapors of indium and gallium are mixed in the mixing chamber 13 by the aforementioned method and then flow out from the linear source evaporation opening 1361 and mix with the elements copper (Cu) and selenium (Se). Finally, the mixed vapor is evaporated and coated onto a substrate to complete the deposition of a CIGS thin film. Wherein, the copper element may be deposited by using the linear evaporation apparatus 1 by the same method as the deposition of the indium and gallium elements, but the evaporation material in the crucibles 11 is changed to the copper element instead.

The following tables show the analysis results of the deposition of the evaporation materials on a glass substrate according to the temperature to area ratio of three elements including indium, gallium and selenium. Table 1 shows the thickness analysis of the indium gallium-selenium layer, and Table 2 shows the composition ratio of the indium-gallium-selenium layer, wherein the composition ratio of the indium-gallium-selenium layers as shown in Table 2 is Ga/In+Ga (GGI).

TABLE 1

| Ratio | Temperature | | |
|---|---|---|---|
| | 1040° C. | 1080° C. | 1120° C. |
| 2 | 0.507 μm | 0.872 μm | 1.723 μm |
| 2.1 | 0.52 μm | 0.875 μm | 2.30 μm |
| 2.2 | 0.532 μm | 0.878 μm | 2.49 μm |
| 2.3 | 0.565 μm | 0.902 μm | 2.54 μm |

TABLE 2

| Ratio | Temperature | | |
|---|---|---|---|
| | 1040° C. | 1080° C. | 1120° C. |
| 2 | 0.21 | 0.18 | 0.16 |
| 2.1 | 0.30 | 0.27 | 0.20 |
| 2.2 | 0.43 | 0.30 | 0.23 |
| 2.3 | 0.46 | 0.38 | 0.30 |

The indium-gallium-selenium thin films manufactured by the aforementioned conditions are analyzed by an X-ray fluorescence spectrometer. If the ratios of the total area of the flow limit holes 1301 formed at both ends of the flow limiting and adjusting layer 130 to the area of the flow limit holes 1301 at the middle is equal to 2.1, 2.2 and 2.3, and the ratio is improved to 2, the indium-gallium-selenium compound thin film has the best gallium content (GGI=0.3) at the temperature of 1040° C.-1120° C. Therefore, the linear evaporation apparatus 1 can manufacture the indium-gallium-selenium thin film with the best gallium content while maintaining the composition and thickness uniformity of the thin film by adjusting the ratio of the temperature and the area of the flow limit holes 130.

Figure 5:
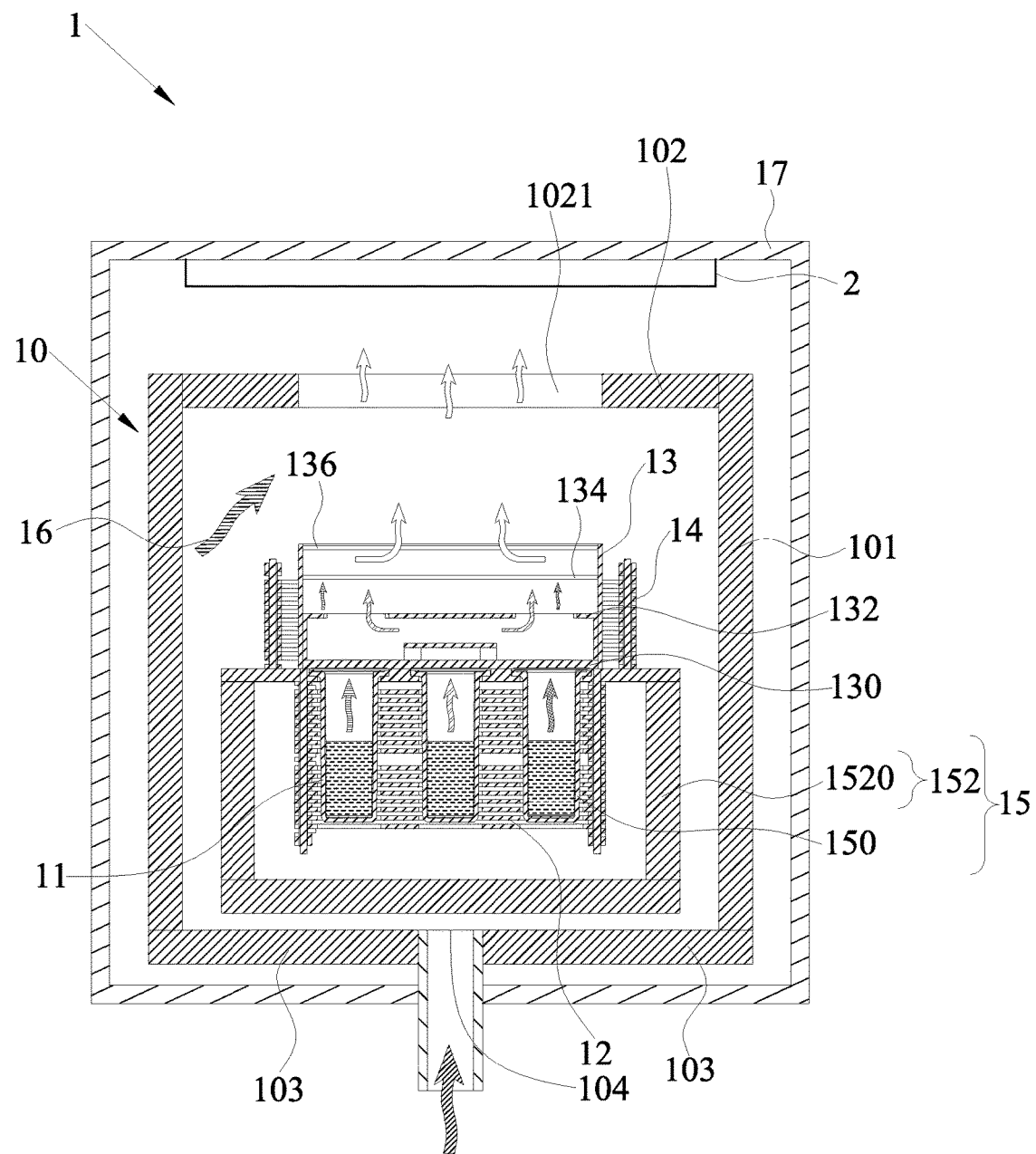
FIG. 5 is a first cross-sectional view of a second preferred embodiment of the present invention.
Figure 6:
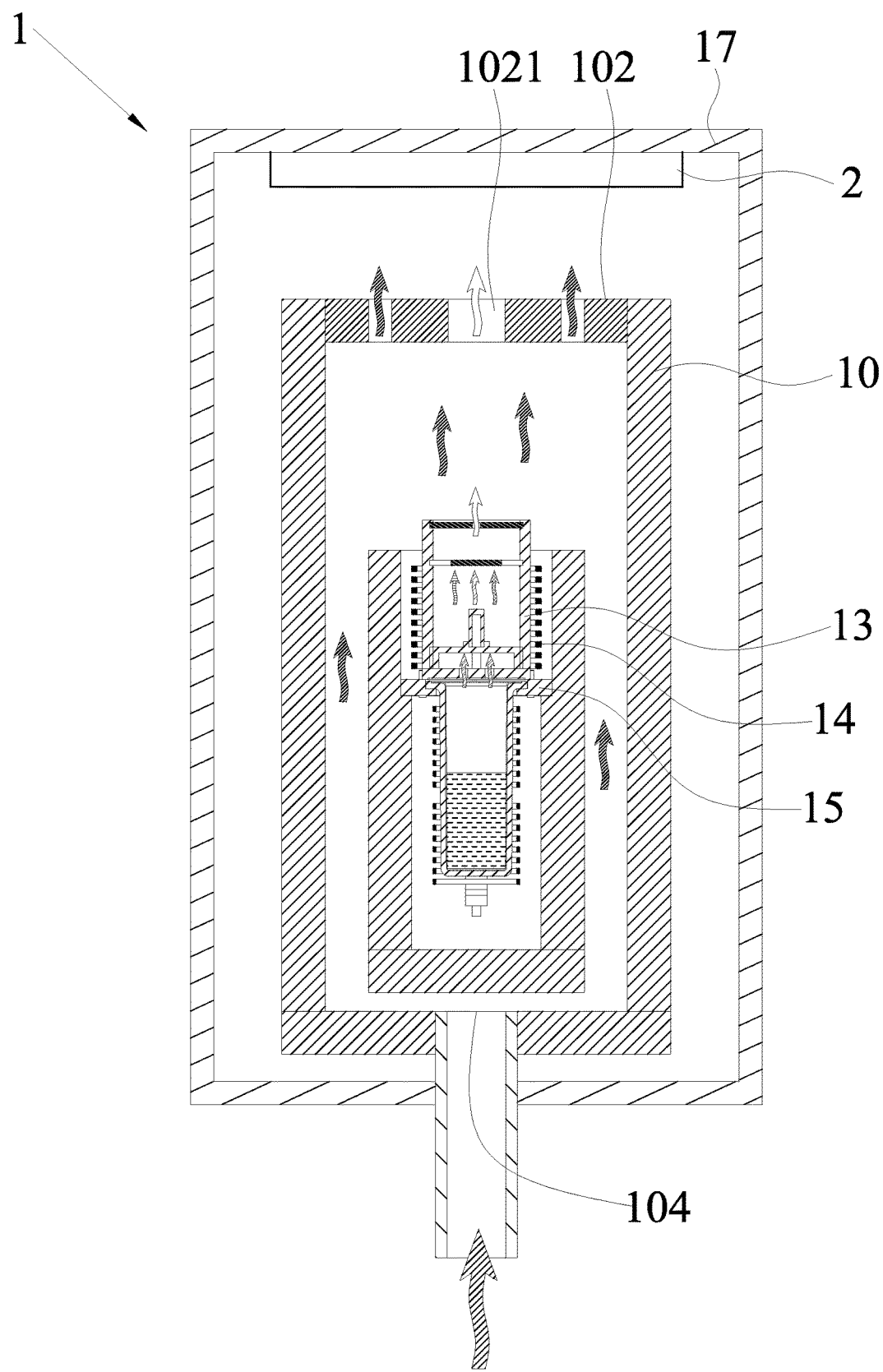
FIG. 6 is a second cross-sectional view of the second preferred embodiment of the present invention.

With reference to FIGS. 5 and 6 for the cross-sectional views of a second preferred embodiment of the present invention, the characteristics of this preferred embodiment same as the first preferred embodiment will not be repeated. In this preferred embodiment, the vapor of a reactive evaporation material 16 is guided into the thermal insulation chamber 10 and reacted with the mixed and evaporated vapor dissipated from the mixing chamber 13 and sprayed out from the thermal insulation chamber 10. In addition, the thermal insulation chamber 10 is disposed in a reaction chamber 17 and used for depositing a film on the substrate 2, and the vapor of the evaporation materials is mixed in the mixing chamber 13 by the mixing method same as the first preferred embodiment, and thus will not be repeated. Preferably, the reactive evaporation material 16 is selenium (Se), sulfur (S), antimony (Sb) or any mixture of the above. The vapor of the reactive evaporation material 16 is limited in the space of the thermal insulation chamber 10. After being mixed uniformly in the mixing chamber 13, the vapor of the reactive evaporation material 16 is reacted with the evaporated vapor, so as to achieve the effects of improving the utilization of the evaporation material and lowering the production cost effectively. It is noteworthy that the thermal insulation chamber 10 is heated continuously in the evaporation process, so that the high-temperature environment inside the thermal insulation chamber 10 cracks vapor of the reactive evaporation material 16 into smaller molecular groups, and the manufactured thin film will be more uniform and dense, and thus the quality of the thin film will be improved.

In this preferred embodiment, the evaporation port 1021 of the top thermal insulation board 102 comes with a plural quantity, and at least one of the evaporation ports 1021 is provided for outputting the vapor of the reactive evaporation material 16, and at least one of the evaporation ports 1021 is provided for outputting the mixed and evaporated vapor, so that a film deposition of the substrate 2 may be performed in the reaction chamber 17. In this preferred embodiment, there are three crucibles 11 for containing different evaporation materials, and the top thermal insulation board 102 has three evaporation ports 1021 arranged parallel with one another, and two of the evaporation ports 1021 are provided for outputting the vapor of the reactive evaporation material 16, and the other evaporation port 1021 is provided for outputting the mixed and evaporated vapor uniformly mixed in the mixing chamber 13. Since the evaporation ports 1021 are arranged parallel to one another, therefore only the mixed and evaporated vapor shows up at the evaporation port 1021 in the middle as shown in the cross-sectional view of FIG. 5. FIG. 6 clearly shows the configuration of the evaporation ports 1021 and the flowing direction of the mixed and evaporated vapor and the vapor of the reactive evaporation material 16. In addition, the reactive evaporation material 16 may be introduced from the bottom or a side of the thermal insulation chamber 10, so that the bottom thermal insulation board 103 or one of the side thermal insulation boards 101 has a guide port 104. In this preferred embodiment, the vapor of the reactive evaporation material 16 enters from the guide port 104 of the bottom thermal insulation board 103. In FIGS. 5 and 6, the reactive evaporation material 16 flows from the guide port 104 into the thermal insulation chamber 10 and is sprayed out from two of the evaporation ports 1021, and the vapor of the evaporation materials is mixed uniformly in the mixing chamber 13 to form the mixed and evaporated vapor that flows into the thermal insulation chamber 10, and the mixed and evaporated vapor is sprayed out from one of the evaporation ports 1021 and mixed with the vapor of the reactive evaporation material 16 for the film deposition of the substrate 2. Wherein, the evaporation ports 1021 provided for spraying out the vapor of the reactive evaporation material 16 may be closed or sealed, so that the vapor of the reactive evaporation material 16 mixed with the mixed and evaporated vapor in the mixing chamber 13 may be sprayed out altogether from the evaporation port 1021

Figure 7:
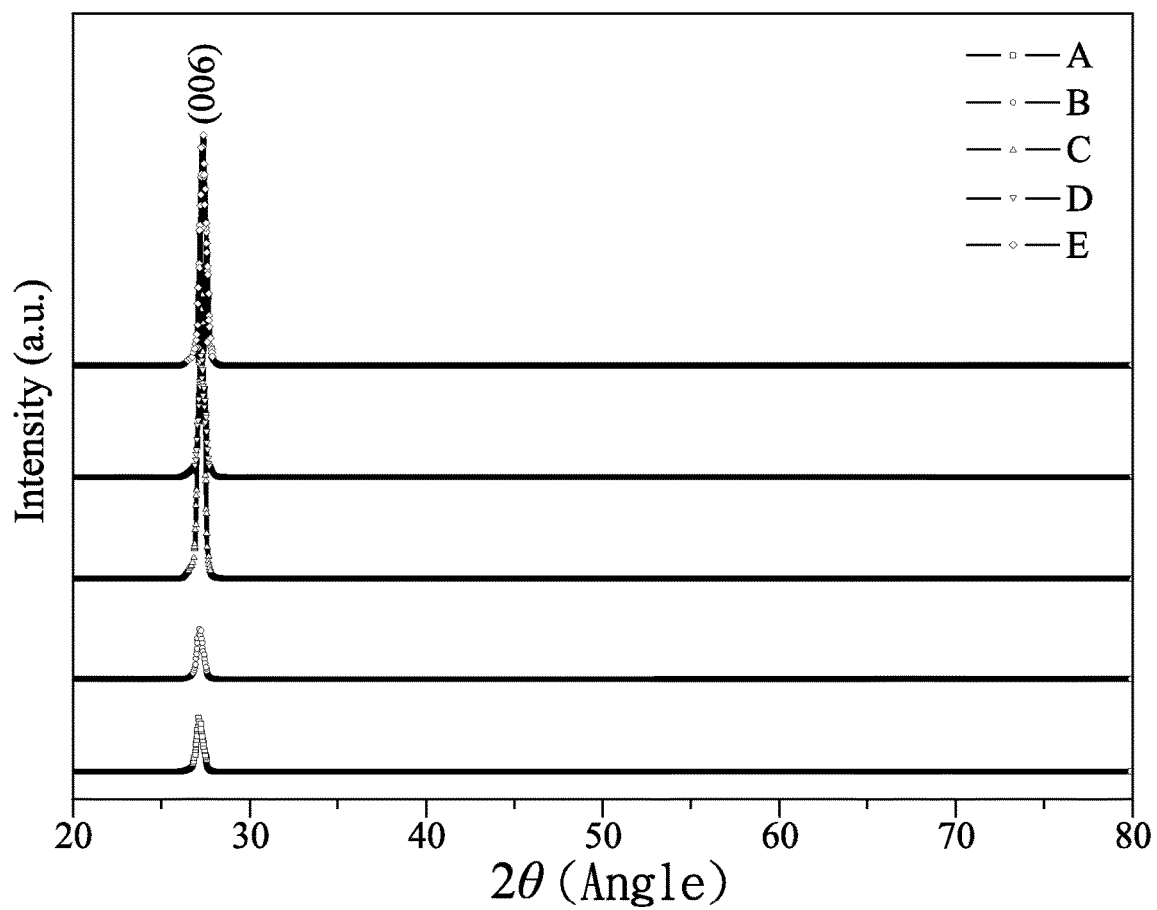
FIG. 7 is a schematic view of a crystal structure made of a thin film in accordance with the second preferred embodiment of the present invention.

With reference to FIG. 7 for a schematic view of a crystal structure made of a thin film in accordance with the second preferred embodiment of the present invention, this preferred embodiment includes two crucibles 11, and the evaporation materials such as indium (In) and gallium (Ga) are put into the crucibles 11 respectively, and the interior of the reaction chamber 17 is situated at a vacuum state, and the pressure is controlled to approximately $1 \times 10^{-6}$ Torr, and the ratio of the area of the flow limit hole 1301 of the crucible 11 containing gallium to the area of the flow limit hole 1301 of the crucible 11 containing indium is set to 2, 2.1, 2.2, 2.3 and 2.4, and the thin films manufactured by the aforementioned area ratios are labeled as A, B, C, D and E respectively. The evaporation port 1021 is an opening with a length of 25 cm and a width of 2 mm, and the temperature of the evaporation material heaters 12 is set to 1200° C., and the reactive evaporation material 16 is selenium with a temperature of 250° C.-400° C., and the substrate 2 is a glass sheet with a thickness of 3 mm and an area of 30 cm*30 cm, and the distance between the crucibles 11 and the substrate 2 is 30 cm, and the processing time is 10 minutes. During the evaporation process, the evaporation material heaters 12 are used to heat the crucible 11 containing indium and the crucible 11 containing gallium to produce vapors. The vapors flow into the mixing chamber 13 through the flow limit hole 1301. After being mixed uniformly, the vapors are dissipated out from the linear source evaporation opening 1361 and then mixed with the vapor of the reactive evaporation material 16 filled in the thermal insulation chamber 10, and finally sprayed out from the evaporation port 1021 to perform a film deposition of the substrate 2. After the thin film is formed, the composition of the indium-gallium-selenium thin film is analyzed by an X-ray fluorescence spectrometer. In Table 3, the ratio of the area of the flow limit hole 1301 corresponsive to gallium and the area of the flow limit hole 1301 corresponsive to indium controls the gallium/(indium+gallium) composition [Ga/(In+Ga)] to be 0.2-0.4, and most of the indium-gallium-selenium thin films manufactured by evaporating selenium are polycrystalline structures, and the indium-gallium-selenium thin film manufactured by the aforementioned conditions is analyzed by an X-ray diffraction analyzer. In FIG. 7, the indium-gallium-selenium thin film manufactured by the present invention has a crystal structure of $(In,Ga)_2Se_3(006)$, so that the thin film structure of the present invention is a single-crystal thin film with the features of better crystallization effect, higher density, and flatter film surface, and the thin film with high stability can be applied in various different fields such as the field of CIGS solar cells.

TABLE 3

| | Serial Number | | | | |
|---|---|---|---|---|---|
| | A | B | C | D | E |
| Area Ratio of Ga/In Flow Limit Holes | 2 | 2.1 | 2.2 | 2.3 | 2.4 |
| Composition Ratio of Ga/(In + Ga) | 0.2 | 0.25 | 0.3 | 0.35 | 0.4 |

Figure 8:
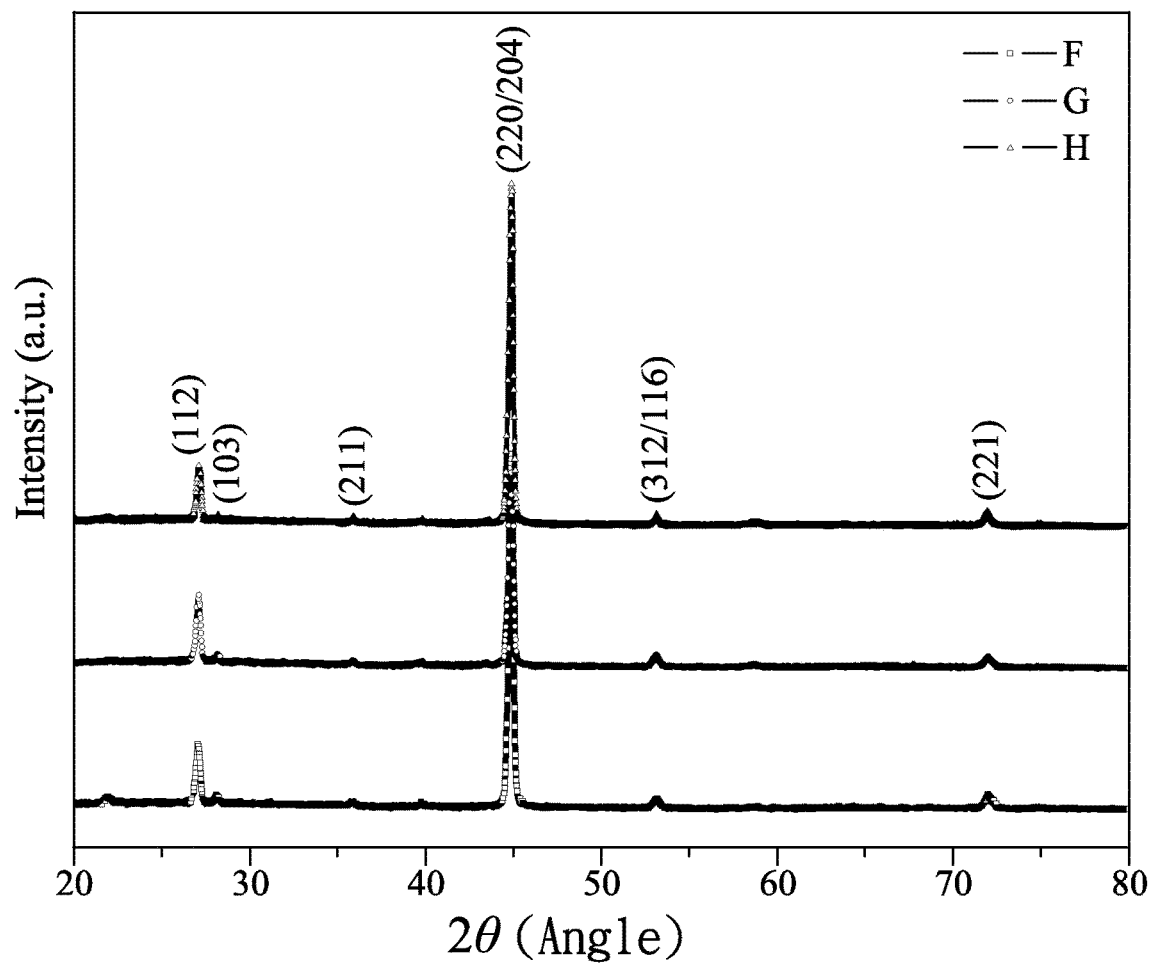
FIG. 8 is a schematic view of a crystal structure made of a thin film in another manufacturing condition in accordance with the second preferred embodiment of the present invention.
Figure 9:
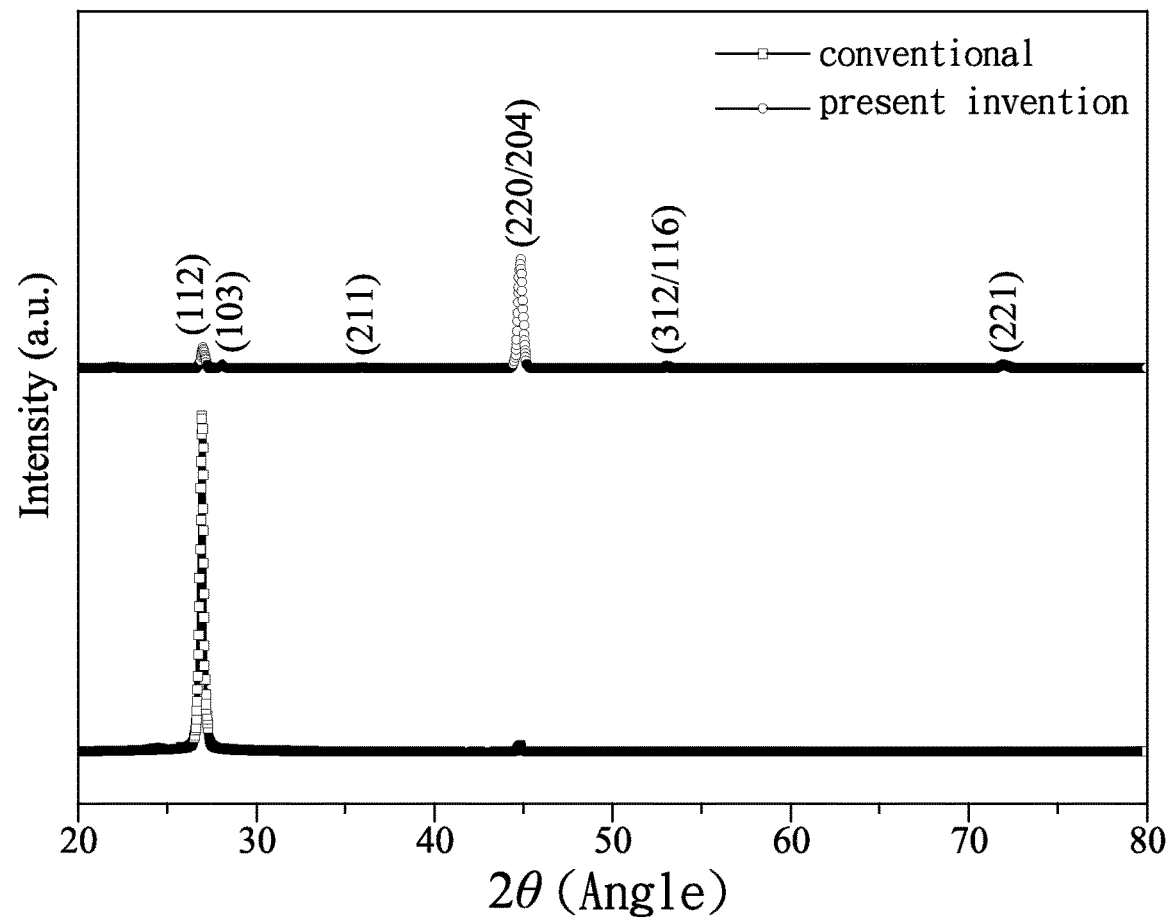
FIG. 9 is a schematic view comparing a crystal structure made of a thin film in accordance with the second preferred embodiment of the present invention with a crystal structure made of a thin film by a conventional method.

With reference to FIGS. 8 and 9 for a schematic view of a crystal structure made of a thin film in another manufacturing condition in accordance with the second preferred embodiment of the present invention and a schematic view comparing a crystal structure made of a thin film in accordance with the second preferred embodiment of the present invention with a crystal structure made of a thin film by a conventional method respectively, the second preferred embodiment includes three crucibles 11 for putting the evaporation materials including indium, gallium and copper (Cu) therein, and the interior of the reaction chamber 17 is maintained at a vacuum state, and the pressure is controlled to approximately $1 \times 10^{-6}$ Torr, and the ratio of the area of the flow limit hole 1301 of the crucible 11 containing gallium and the area of the flow limit hole 1301 of the crucible 11 containing indium is controlled to 2.2, and a ratio of the area of the flow limit hole 1301 of the crucible 11 containing copper to the total area of the flow limit holes 1301 of the crucibles 11 containing indium and gallium respectively is defined and set to 5, 7.5 and 10, and the thin films with such ratios are labeled as F, G and H respectively. Like the aforementioned embodiment, the evaporation port 1021 is also an opening with a length of 25 cm and a width of 2 mm, and the temperature of the evaporation material heaters 12 is set to 1200° C., and the reactive evaporation material 16 is selenium with a temperature of 250° C.-400° C., and the substrate 2 is a glass sheet with a thickness of 3 mm and an area of 30 cm*30 cm, and the distance between the crucibles 11 and the substrate 2 is 30 cm, and the processing time is 10 minutes. Like the manufacturing process of the aforementioned embodiment, the evaporation material heaters 12 heat the crucibles 11 containing in the evaporation material in an evaporation process to produce vapors, and the vapors are passed into the mixing chamber 13 through the flow limit holes 1301. After the vapors are mixed, a mixed and evaporated vapor is produced and dissipated from the linear source evaporation opening 1361, and then mixed with the vapor of the reactive evaporation material 16 filled in the thermal insulation chamber 10, and finally sprayed out from the evaporation port 1021 to perform a film deposition of the substrate 2. After the thin film is formed, an X-ray fluorescence spectrometer is used for analyzing the composition of the copper-indium-gallium-selenium thin film. In Table 4, the ratio of the area of the flow limit hole 1301 corresponsive to gallium to the area of the flow limit hole 1301 corresponsive to indium is maintained constant, and the ratio of the area of the flow limit hole 1301 corresponsive to copper to the total area of the flow limit holes 1301 corresponsive to indium and gallium respectively is changed to control the proportion [Cu/(In+Ga)] within a range of 0.8-0.9, and the copper-indium-gallium-selenium thin film is analyzed by an X-ray diffraction analyzer. FIG. 8 shows the preferred-orientation crystal structure of Cu(In,Ga)Se$_2$(220/204). In FIG. 9, the comparison line segment represents a crystal structure of a copper-indium-gallium-selenium thin film obtained by a general evaporated selenium, and such crystal structure is a polycrystalline (112) preferred-orientation structure, and the comparison line segment represents a crystal structure of a copper-indium-gallium-selenium thin film manufactured by the present invention, and such crystal structure is a preferred-orientation crystal structure of Cu(In, Ga)Se$_2$(220/204). Therefore, the thin film manufactured by the present invention has a better crystallization effect, and the advantages of its high stability and uniformity allows it to be used in various different fields such as the field of CIGS solar cells.

TABLE 4

|  | Serial Number | | |
| --- | --- | --- | --- |
|  | F | G | H |
| Area Ratio of Cu/(In + Ga) Flow Limit Holes | 5 | 7.5 | 10 |
| Composition Ratio of Cu/(In + Ga) | 0.8 | 0.85 | 0.9 |

What is claimed is:

1. A linear evaporation apparatus, comprising a thermal insulation chamber, a plurality of crucibles, a plurality of evaporation material heaters, and a mixing chamber; the crucibles, the evaporation material heaters and the mixing chamber being disposed in the thermal insulation chamber, and the evaporation material heaters being sheathed on the crucibles respectively for heating the crucibles, and the mixing chamber being interconnected to an opening of each of the crucibles, characterized in that the mixing chamber from a near position to a far position of the crucibles sequentially comprises a flow limiting and adjusting layer, a flow channel adjusting member, a mixed layer and a linear evaporation layer, wherein the flow limiting and adjusting layer is a rectangular sheet having a plurality of flow limit holes corresponsive to the crucibles respectively, and the flow channel adjusting member is an interconnected structure having at least one flow inlet and at least one flow outlet, and the flow channel adjusting member is configured to encompass at least one of the flow limiting holes, but not all of the flow limiting holes, and the mixed layer is a substantially I-shaped sheet structure, and the linear evaporation layer is a rectangular sheet having a linear source evaporation opening tapered from both ends to the middle of the linear evaporation layer, wherein, during evaporation process, the evaporation material heaters are used to heat the crucibles to produce vapors, the vapors flow into the mixing chamber through the flow limit holes to form a first vapor mixture, then the vapors flow through the passage and flow out from the linear evaporation layer via the linear source evaporation opening, the vapors are further mixed with vapors of a reactive evaporation material filled in the thermal insulation chamber and sprayed out to perform a film deposition of the substrate, wherein the linear evaporation apparatus comprises three crucibles, and both ends and the middle of the flow limiting and adjusting layer have two flow limit holes each, the flow channel adjusting member is a substantially cross-shaped interconnected structure comprised of two horizontal members and a vertical member, and the two horizontal members are communicated with the vertical member and disposed on both sides of the vertical member respectively, each of the horizontal members on both sides of the vertical member has the flow inlet, and each side of the vertical member has the flow outlet, and the flow inlets of the horizontal members on both sides of the vertical member are disposed at positions corresponsive to the two flow limit holes at the middle of the flow limiting and adjusting layer, and the vertical member is disposed at a position other than those of the flow limit holes, and the flow limit holes on both sides of the vertical member are divided into two regional positions, and the two flow outlets are disposed between the two flow limit holes formed at both ends of the flow limiting and adjusting layer respectively.

2. The linear evaporation apparatus as claimed in claim 1, wherein the linear source evaporation opening is tapered linearly or nonlinearly from both ends to the middle of the linear source evaporation opening.

3. The linear evaporation apparatus as claimed in claim 2, further comprising a mixing chamber heater covered around the external periphery of the mixing chamber.

4. The linear evaporation apparatus as claimed in claim 3, further comprising a crucible support having a crucible containing member and a fastener, wherein the crucible containing member is provided for containing the crucibles, and the fastener is comprised of a plurality of fixing plates and disposed around the outer side of the crucible containing member for fixation.

5. The linear evaporation apparatus as claimed in any one of claim 1, wherein the thermal insulation chamber is provided for guiding a vapor of a reactive evaporation material therein to react with a mixed and evaporated vapor dissipated from the mixing chamber and spray out from the thermal insulation chamber.

6. The linear evaporation apparatus as claimed in claim 5, further comprising a reaction chamber, and the thermal insulation chamber being disposed in the reaction chamber.

7. The linear evaporation apparatus as claimed in claim 6, wherein the thermal insulation chamber is comprised of a plurality of side thermal insulation boards, a top thermal insulation board and a bottom thermal insulation board, and the top thermal insulation board has an evaporation port formed thereon.

8. The linear evaporation apparatus as claimed in claim 7, wherein the reactive evaporation material is one selected from a group consisting of selenium, sulfur, antimony, and a mixture thereof.

* * * * *